United States Patent
Bayerer (10) Patent No.: US 8,992,267 B2
(45) Date of Patent: Mar. 31, 2015

(54) CONNECTING SYSTEM FOR ELECTRICALLY CONNECTING ELECTRONIC DEVICES AND METHOD FOR CONNECTING AN ELECTRICALLY CONDUCTIVE FIRST CONNECTOR AND AN ELECTRICALLY CONDUCTIVE SECOND CONNECTOR

(75) Inventor: Reinhold Bayerer, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 459 days.

(21) Appl. No.: 12/980,115

(22) Filed: Dec. 28, 2010

(65) Prior Publication Data

US 2012/0164865 A1   Jun. 28, 2012

(51) Int. Cl.
*H01R 13/42* (2006.01)
*H05K 3/30* (2006.01)
*H01R 12/58* (2011.01)

(52) U.S. Cl.
CPC ............. *H05K 3/308* (2013.01); *H01R 12/585* (2013.01); *H05K 2201/10166* (2013.01); *H05K 2201/10409* (2013.01); *H05K 2201/1059* (2013.01); *H05K 2201/10856* (2013.01); *H01L 2924/0002* (2013.01)
USPC ............................ 439/751; 439/345; 439/626

(58) Field of Classification Search
USPC .............................. 439/345, 72–84, 744, 745
See application file for complete search history.

(56) References Cited

U.S. PATENT DOCUMENTS

| | | | | |
|---|---|---|---|---|
| 3,452,149 A * | 6/1969 | Rinaldi | ......................... | 174/261 |
| 3,890,025 A * | 6/1975 | Gray | ............................. | 439/265 |
| 4,526,429 A * | 7/1985 | Kirkman | ......................... | 439/82 |
| 4,660,281 A * | 4/1987 | Omand | ............................ | 29/764 |
| 4,912,401 A * | 3/1990 | Nady et al. | ................ | 324/756.05 |
| 5,083,927 A * | 1/1992 | Herard et al. | .................... | 439/80 |
| 5,147,221 A * | 9/1992 | Cull et al. | ...................... | 439/585 |
| 5,154,621 A * | 10/1992 | Legrady | .......................... | 439/82 |
| 5,509,814 A * | 4/1996 | Mosquera | ....................... | 439/82 |
| 5,575,691 A * | 11/1996 | Matthews | ...................... | 439/744 |
| 5,882,221 A * | 3/1999 | Nguyen et al. | ................ | 439/331 |
| 5,928,023 A * | 7/1999 | Buckner et al. | ............... | 439/373 |
| 6,135,812 A | 10/2000 | Harting et al. | | |
| 7,604,491 B1 | 10/2009 | Ahmad et al. | | |

(Continued)

FOREIGN PATENT DOCUMENTS

CN    2857263 Y    1/2007
DE    19749890 C1    5/1999

(Continued)

OTHER PUBLICATIONS

Stolze, et al. "Reliability of PressFIT Connections." PCIM. Bodo's Power, Jun. 2008. pp. 34-40.

*Primary Examiner* — Briggitte R Hammond
(74) *Attorney, Agent, or Firm* — Murphy, Bilak & Homiller, PLLC (57) ABSTRACT

A connecting system for electrically connecting electronic devices includes an electrically conductive first connector, an electrically conductive second connector and a clip element. The first connector is insertable in the second connector. The first connector or the second connector has a first opening into which the clip element can be inserted. In the inserted state, the clip element generates a contact pressure due to which the first connector and the second connector are pressed against one another so that an electrical contact between the first connector and the second connector is safeguarded.

19 Claims, 9 Drawing Sheets

(56) References Cited

U.S. PATENT DOCUMENTS

| | | |
|---|---|---|
| 7,791,208 B2 | 9/2010 | Bayerer |
| 7,847,390 B2 | 12/2010 | Tabata |
| 2002/0115316 A1* | 8/2002 | Bright ............................ 439/82 |
| 2003/0102357 A1 | 6/2003 | Downes |
| 2007/0155249 A1* | 7/2007 | Cheng ........................... 439/668 |
| 2007/0278669 A1* | 12/2007 | Hierholzer et al. ........... 257/718 |
| 2008/0172853 A1* | 7/2008 | Domitrovits et al. ........ 29/426.5 |
| 2009/0190318 A1 | 7/2009 | Komatsu |
| 2010/0284155 A1 | 11/2010 | Stolze et al. |
| 2011/0256749 A1 | 10/2011 | Bayerer |

FOREIGN PATENT DOCUMENTS

| | | |
|---|---|---|
| DE | 20218295 U1 | 4/2003 |
| DE | 102005018116 A1 | 11/2006 |
| DE | 102008048505 A1 | 6/2009 |
| DE | 102009002993 A1 | 11/2010 |
| DE | 10 2010 003 367 A1 | 9/2011 |

* cited by examiner

CONNECTING SYSTEM FOR ELECTRICALLY CONNECTING ELECTRONIC DEVICES AND METHOD FOR CONNECTING AN ELECTRICALLY CONDUCTIVE FIRST CONNECTOR AND AN ELECTRICALLY CONDUCTIVE SECOND CONNECTOR

FIELD OF THE INVENTION

The invention relates to semiconductor modules.

BACKGROUND

For many electric connections between electric connectors of electronic units as used, for example, in power electronics circuitry, the electric connectors are required to have a low electrical resistance, a high ampacity, and to allow for a quick and simple connection and disconnection. Therefore, there is a need for an improved connecting system and for an improved method for electrically conductive connectors.

SUMMARY

According to an embodiment, a connecting system for electrically connecting electronic devices includes an electrically conductive first connector, an electrically conductive second connector and a clip element. The first connector is insertable in the second connector. The first connector or the second connector comprises a first opening. The clip element is designed to be inserted into the first opening so as to generate a contact pressure due to which the first connector and the second connector are pressed against one another so that an electrical contact between the first connector and the second connector is safeguarded.

According to another embodiment, a power semiconductor module system includes a power semiconductor module, an electrical component which is electrically connectable to the power semiconductor module, an electrically conductive first connector, an electrically conductive second connector, and a clip element. The first connector is insertable in the second connector. The clip element is designed to be inserted into a first opening of the first or second connector. If the clip element is inserted in the first opening, it generates a contact pressure due to which the first connector and the second connector are pressed against one another so that an electrical contact between the first connector and the second connector is safeguarded. Either the first connector is a part of the power semiconductor module and the second connector is a part of the electrical component, or the second connector is a part of the power semiconductor module and the first connector is a part of the electrical component.

According to a further embodiment, in a method for connecting an electrically conductive first connector and an electrically conductive second connector, a connecting system for electrically connecting electronic devices is provided. The connecting system includes an electrically conductive first connector, an electrically conductive second connector, and a clip element. The first connector is insertable in the second connector. The first connector or the second connector comprises a first opening into which the clip element is inserted.

According to still a further embodiment, in a method for electrically connecting a power semiconductor module and an electrical component, a power semiconductor module system is provided. The power semiconductor module system includes a power semiconductor module, an electrical component electrically connectable to the power semiconductor module, an electrically conductive first connector, an electrically conductive second connector, and a clip element. The first connector is insertable in the second connector. The first connector or the second connector comprises a first opening. Either the first connector is a part of the power semiconductor module and the second connector is a part of the electrical component, or the second connector is a part of the power semiconductor module and the first connector is a part of the electrical component. The clip element is inserted into the first opening so that a contact pressure is generated due to which the first connector and the second connector are pressed against one another so that an electrical contact between the first connector and the second connector is safeguarded.

Those skilled in the art will recognize additional features and advantages upon reading the following detailed description, and upon viewing the accompanying drawings.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION

In the following Detailed Description, reference is made to the accompanying drawings, which form a part thereof, and in which is shown by way of illustration specific embodiments in which the invention may be practiced. In this regard, directional terminology, such as "top," "bottom," "front," "back," "leading," "trailing," etc., is used with reference to the orientation of the FIGs being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figures 1A, 1B:
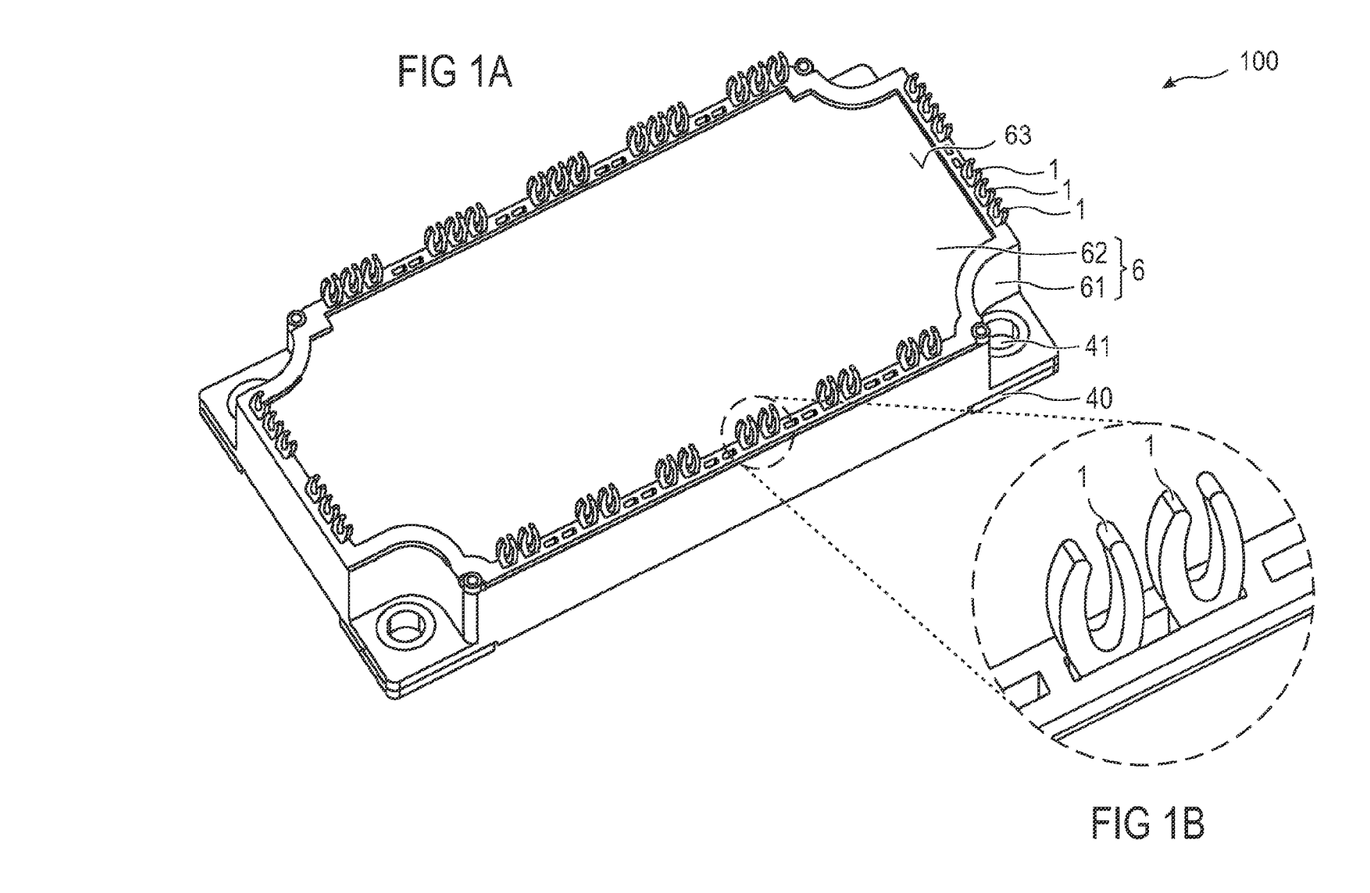
FIG. 1A is a perspective view of a power semiconductor module.
FIG. 1B is an enlarged view of a portion of the power semiconductor module of FIG. 1A.

Referring now to FIG. 1 there is illustrated a power semiconductor module 100 with a base plate 40 and a housing 6. The housing 6 has an electrically insulating housing frame 61 and an optional housing cover 62. The housing frame 61 surrounds at least one power semiconductor chip, for instance a MOSFET (metal oxide semiconductor field effect transistor), an IGBT (insulated gate bipolar transistor), a J-FET (junction field effect transistor), a diode, a thyristor, etc. positioned inside the housing 6. The base plate 40 is configured as a metal base plate, representing the bottom housing wall of the module 100. The base plate 40 may range from 0.1 mm to 20 mm thick and exhibits a low thermal resistance so as to allow for the dissipation of waste heat produced by the least one power semiconductor chip toward a heat sink (not shown) which may be attached to the side of the base plate 40 facing away from the at least one power semiconductor chip. For example, the base plate 40 may be made of copper or aluminum, or of an alloy with at least one of copper or aluminum. The footprint of the base plate 40 is substantially rectangle with rounded corners. Close to each of the corners there is an opening 41 which can be used for attaching the base plate 40 to a heat sink e.g., via screws.

To electrically connect the power semiconductor module 100 to an arbitrary peripheral device, there is a number of first connectors 1 inserted in the housing frame 61. Alternatively, one, more or each of the first connectors 1 can extend through the housing cover 62. For instance, first connectors 1 may be formed of copper or may comprise at least 99.8 weight % copper.

In the present example, the first connectors 1 are designed as press-fit connectors, i.e., as connectors which can be pressed into an electrical contact opening of the peripheral device, thereby establishing an electrical contact between each one of the first connectors 1 and the respective contact opening. Even though the press-fit connectors 1 are designed as bifurcated press-fit connectors, other designs may also be used.

Figures 2A, 2B:
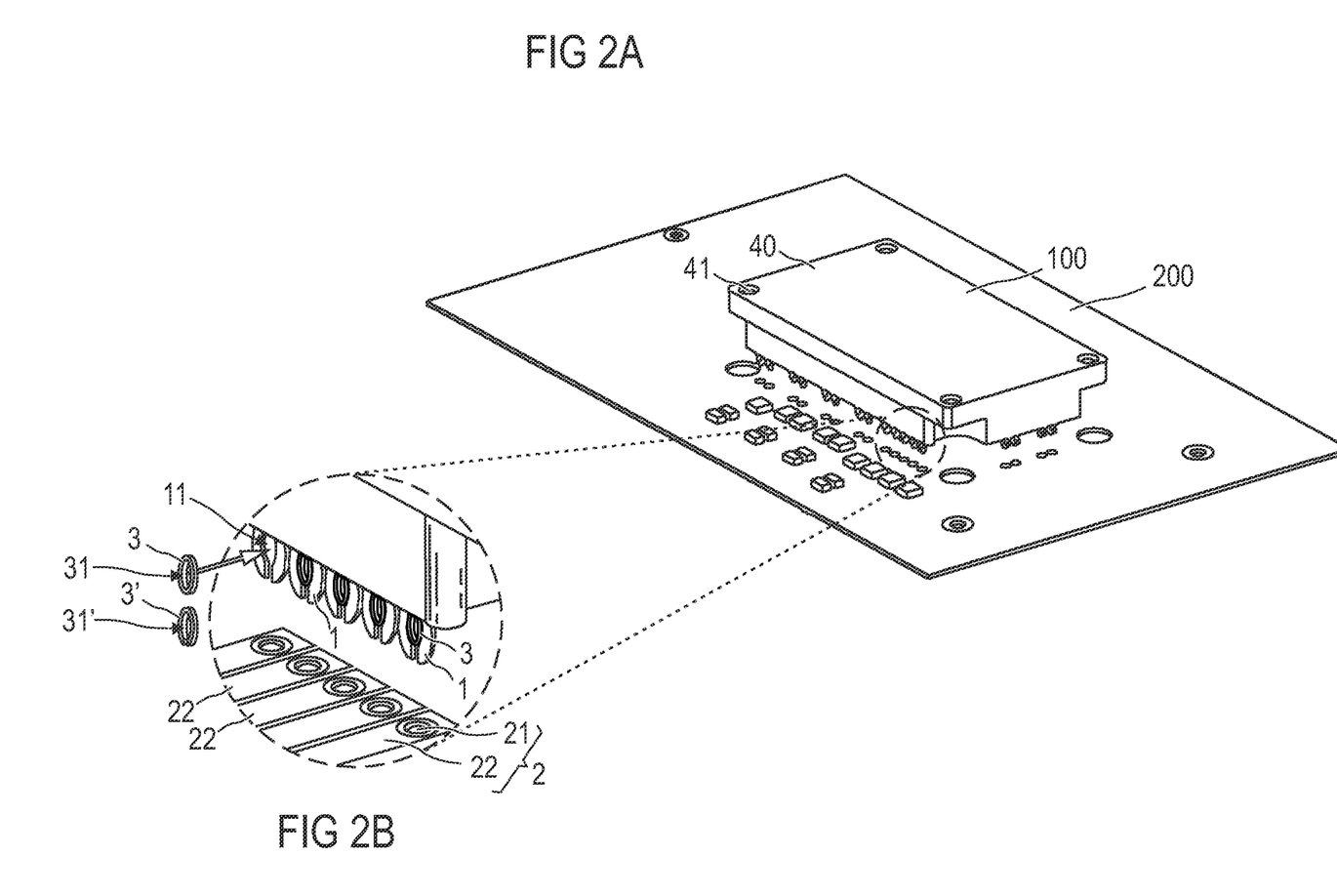
FIG. 2A is a perspective view of the power semiconductor module of FIG. 1A prior to being mounted to a printed circuit board.
FIG. 2B is an enlarged view of a detail of the power semiconductor module of FIG. 2A showing press-fit contacts each having an opening in which a clip is inserted.

In the example of FIG. 2A, the power semiconductor module 100 shown in FIG. 1A is to be electrically connected to a printed circuit board 200. For that purpose, as can be seen in the selective enlargement of FIG. 2B, the printed circuit board 200 is equipped with a number of contact openings 21 formed in conductor tracks 22 of the printed circuit board 200. In the sense of the present invention, each of the conductor tracks 22 together with the respective contact opening 21 forms a second connector 2 which is to be connected to one of the first connectors 1. The power semiconductor module 100 can be connected to the printed circuit board 200 simply by pressing the first connectors 1 into the respective openings 21. Further soldering or welding is possible, but not required.

As also can be seen from FIG. 2B, each of the first connectors 1 is provided with an opening 11 in which, prior to mounting the power semiconductor module 100 to the printed circuit board 200, a clip element 3 can be inserted. For example, the clip element 3 may be formed as a closed ring. However, a clip element 3' which is designed as an open ring may be used instead. Due to the ring shape, both types of clip elements 3 and 3' feature a clearance 31 and 31', respectively. The clip elements 3 and 3' generate a contact pressure due to which the first connector 1 and the second connector 2 are pressed against one another so that a tight electrical contact between the first connector 1 and the second connector 2 is safeguarded.

Figure 3A:
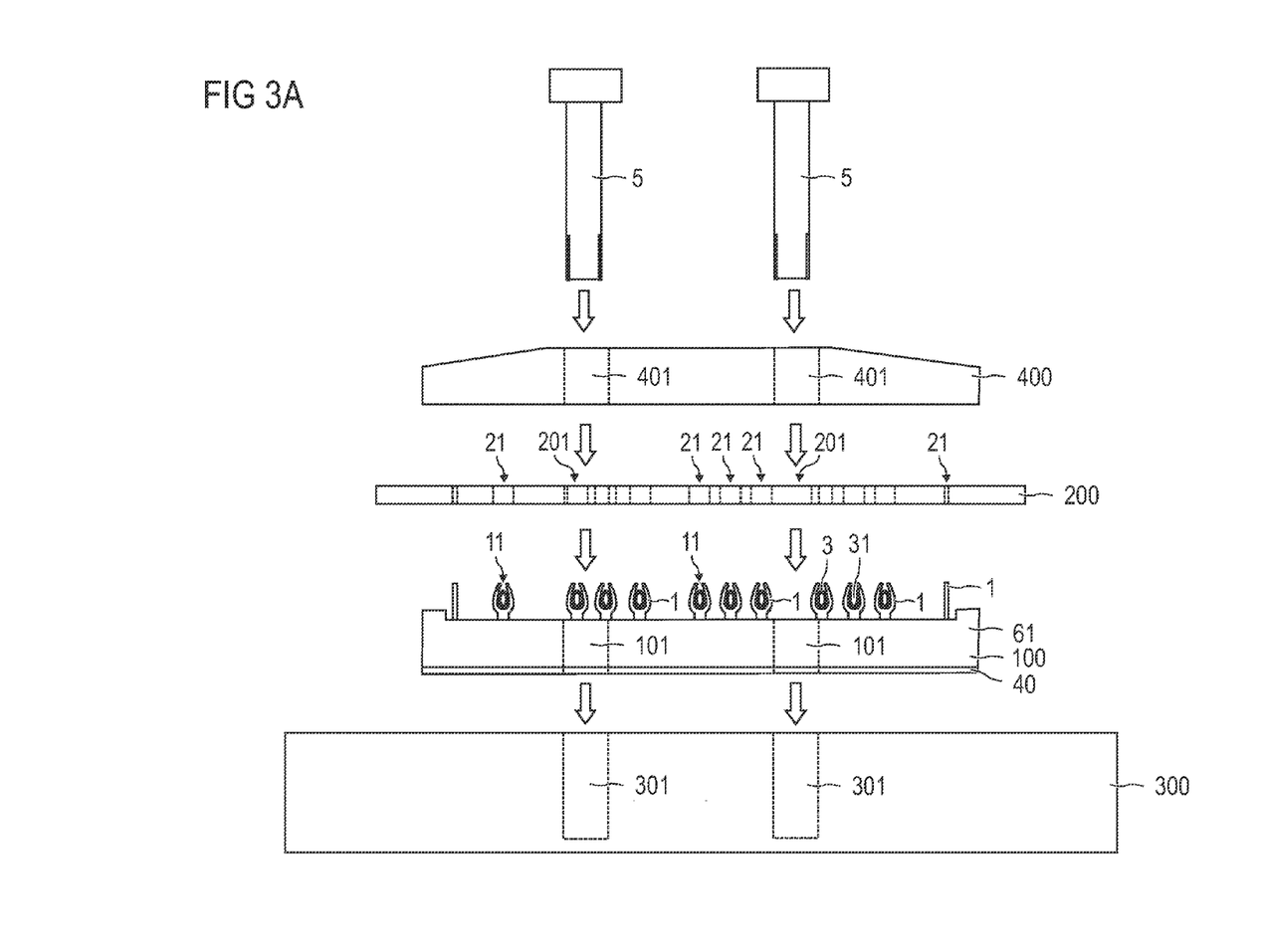
FIG. 3A is a side view of a power semiconductor module prior to being mounted to a printed circuit board.

FIG. 3A is a side view of another power semiconductor module 100 prior to being mounted to a printed circuit board 200 and a heat sink 300 e.g. by screws 5. On its top side, the power semiconductor module 100 is equipped with a number of first connectors 1 which are designed as bifurcated press-fit connectors as already described with reference to FIGS. 1A, 1B, 2A and 2B. Each one of the first connectors 1 is provided with an opening 11 in which a ring-shaped clip element 3 is inserted. By screwing the printed circuit board 200, the power semiconductor module 100 and the heat sink 300 together, each one of the first connectors 1 is pressed into a corresponding opening 21 of a printed circuit board track of the printed circuit board 200. In order to thereby evenly distribute the pressure generated by the screws 5, an optional thrust piece 400 may be arranged between the printed circuit board 200 and the screws 5. When a first connector 1 of the module 100 is pressed into a corresponding opening 21 of the printed circuit board 200, the connector 1 and the clip element 3 inserted in the opening 11 of the first connector 1 are pretensioned so that the clip element 3 generates a back pressure which serves as contact pressure due to which the first connector 1 and the second connector 2 are pressed against one another and an electrical contact between the first connector 1 and the second connector 2 is safeguarded.

Figure 3B:
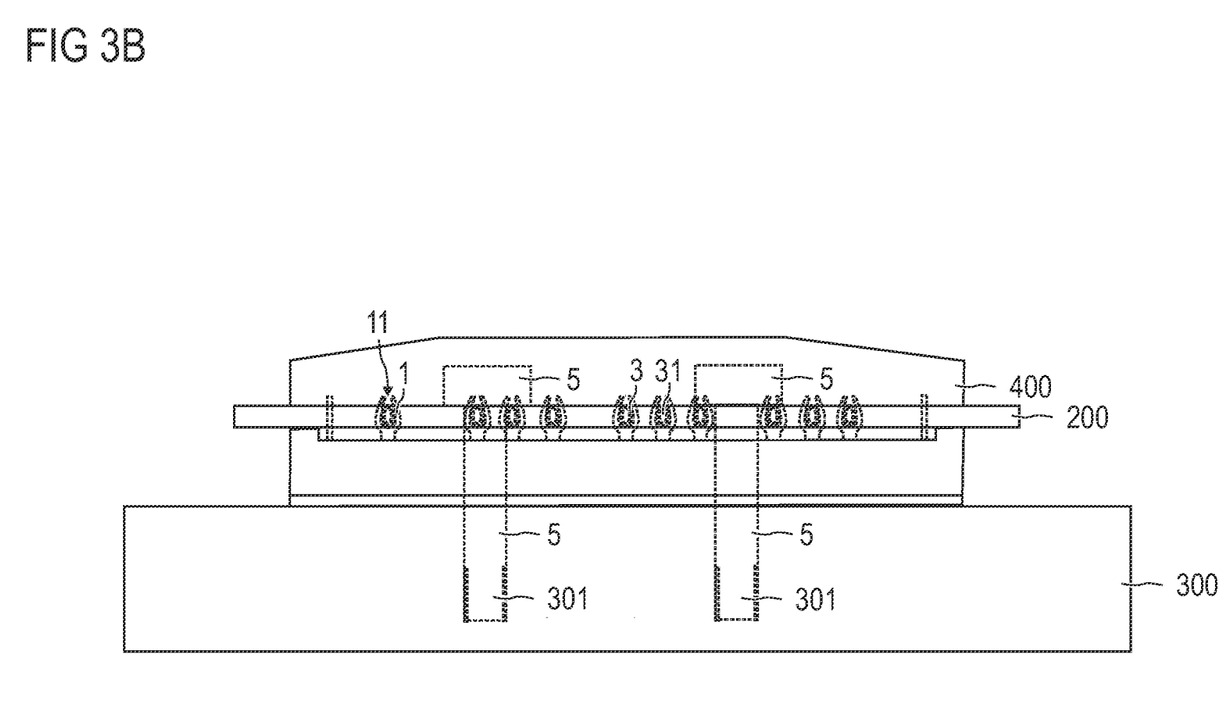
FIG. 3B is a side view of a power semiconductor module of FIG. 3A mounted to a printed circuit board.

In the view of FIG. 3A, the openings 21 are hidden and therefore indicated with dashed lines. The same applies to screw passages 401 of the thrust piece 400, to screw passages 201 of the printed circuit board 200, to screw passages 101 of the power semiconductor module 100, and to threaded holes 301 of the heat sink 300. Optionally, a heat conductive paste may be arranged between the power semiconductor module 100 and the heat sink 300. FIG. 3B shows the components of FIG. 3A in the assembled state.

Figure 4A:
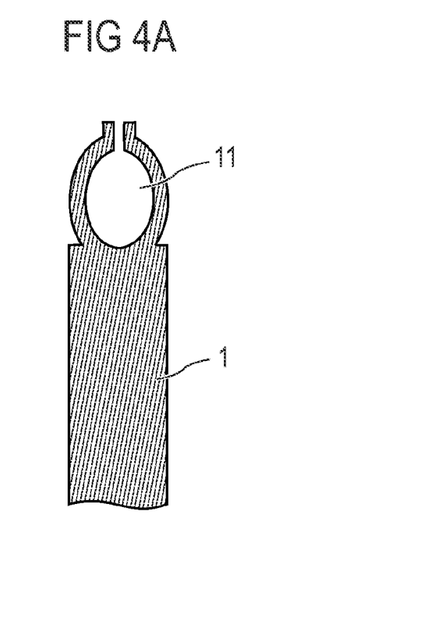
FIG. 4A is a cross-sectional view of a press-fit connector of a power semiconductor module having an opening.
Figure 4B:
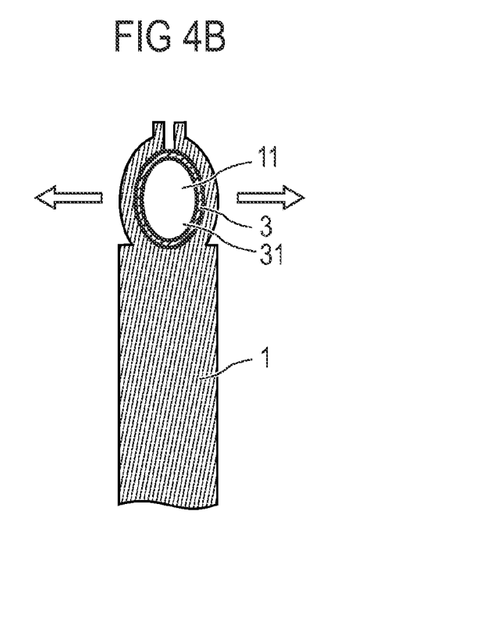
FIG. 4B is a cross-sectional view of the press-fit connector of FIG. 4A with a clip inserted in the opening.

FIG. 4A is a cross-sectional view of a press-fit connector 1 of a power semiconductor module. The press-fit connector 1 is provided with an opening 11 into which, as shown in FIG. 4B, a clip element 3 may be inserted. Such a connector 1 may be used as first connector 1 as explained with reference to FIGS. 1A, 1B, 2A, 2B, 3A and 3C.

Figures 5A, 5B:
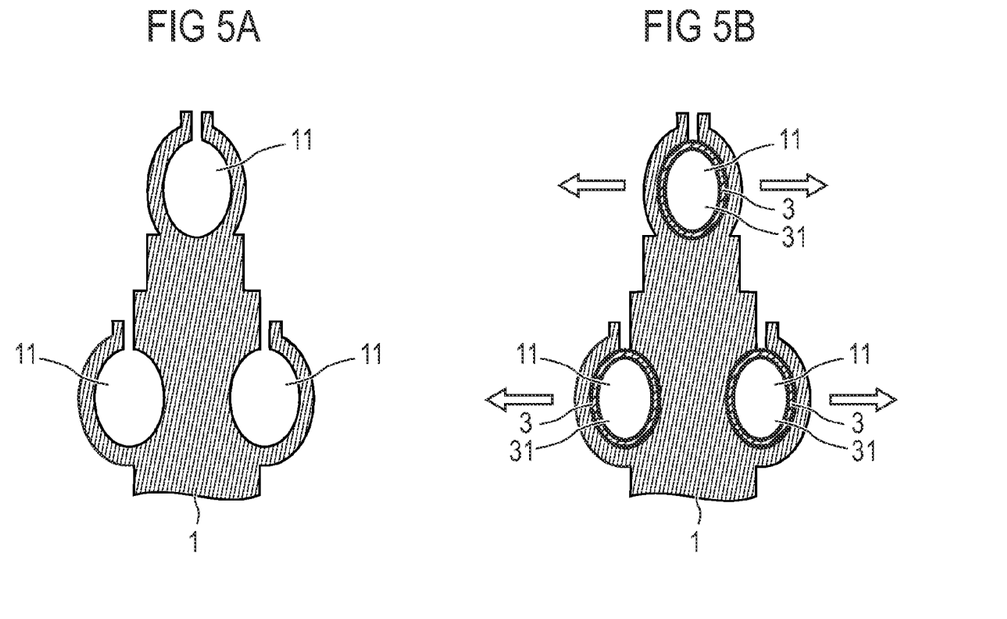
FIG. 5A is a cross-sectional view of a multistage press-fit connector of a power semiconductor module having more than one opening.
FIG. 5B is a cross-sectional view of the multistage press-fit connector of FIG. 5A with a clip inserted in each of the openings.

FIG. 5A shows a further example of a press-fit connector 1 which is designed as multistage press-fit connector, i.e., the connector 1 exhibits more than one press-fit contact zone arranged in different levels. All press-fit contact zones of the same connector 1 are electrically connected to one another. Then, each of the press-fit contact zones is provided with an opening 11. In this example, each of the press-fit contact zones is designed bifurcated. As illustrated in FIG. 5B, into each of the openings 11 a clip element 3 may be inserted.

Figure 6A:
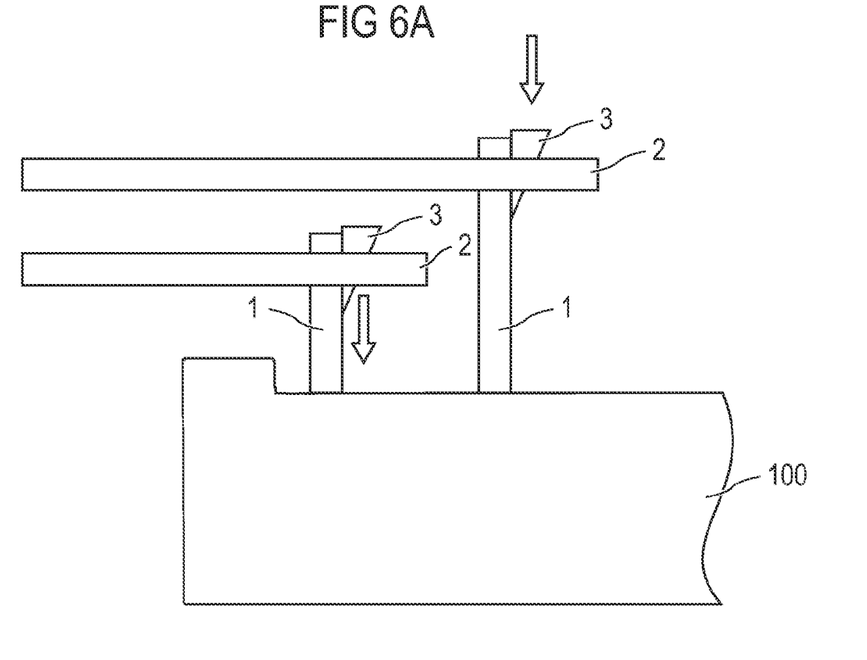
FIG. 6A is cross-sectional view of a section of a power semiconductor module with striplines connected to connectors of the power semiconductor module.
Figure 6B:
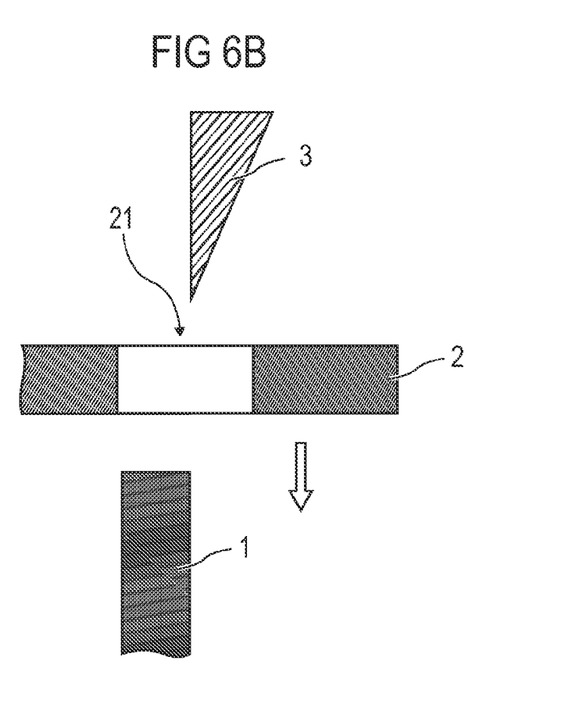
FIG. 6B is a cross-sectional view of one of the connectors of the power semiconductor module of FIG. 6A prior to being connected to the respective stripline.
Figure 6C:
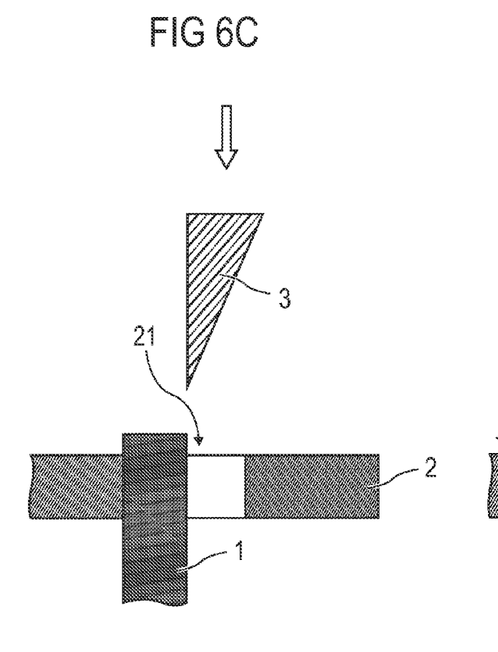
FIG. 6C is a cross-sectional view of connector of FIG. 6B when being inserted into an opening of the stripline.
Figure 6D:
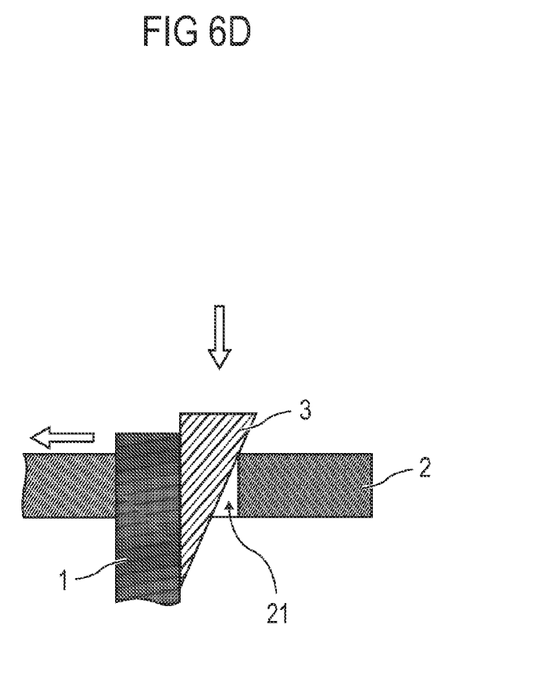
FIG. 6D is a cross-sectional view of the arrangement of FIG. 6C after inserting a tapered clip into the opening of the stripline.

FIG. 6A is a side view of a section of a power semiconductor module 100 which is provided with two first connectors 1. Each one of the first connectors 1 is electrically connected to a stripline 2. For this purpose, each one of the first connectors 1 is, together with a tapered clip element 3, inserted in an opening of the respective stripline 2. The way of connecting a first connector 1 to the respective stripline 2 is illustrated in FIGS. 6B to 6D. As can be seen in the cross-sectional view of FIG. 6B, a first connector 1, a second connector 2 in the form of a stripline, and a tapered clip element 3 are provided. The stripline 2 features an opening 21 in which an end of the first connector 1 may be inserted so as to achieve an arrangement as illustrated in FIG. 6C. Then, in the same opening 21, the tapered clip element 3 is inserted so that, as illustrated in FIG. 6D, the tapered clip element 3 generates a contact pressure due to which the first connector 1 and the second connector 2 are pressed against one another, and that a tight electrical contact between the first connector 1 and the second connector 2 is safeguarded.

Figure 7:
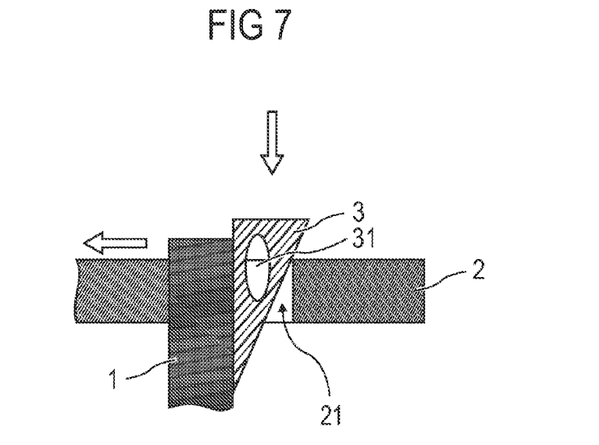
FIG. 7 is a cross-sectional view of a connection between a press-fit connector of a power semiconductor module and a stripline with a tapered clip inserted into an opening of the strip line, the clip including an opening partly arranged inside the opening of the stripline.

In order to further reduce the electrical contact resistance between the first connector 1 and the second connector 2, the clip element 3 may be made of electrically conductive material. If it is desired to improve the elasticity of the clip element 3, it may be provided with a clearance 31 as illustrated in FIG. 7. In a state in which the clip element 3 is inserted in the opening 21 of the second connector 2, the clearance 31 of the clip element 3 may be arranged at least partly within the opening 21 of the second connector 2.

Figure 8A:
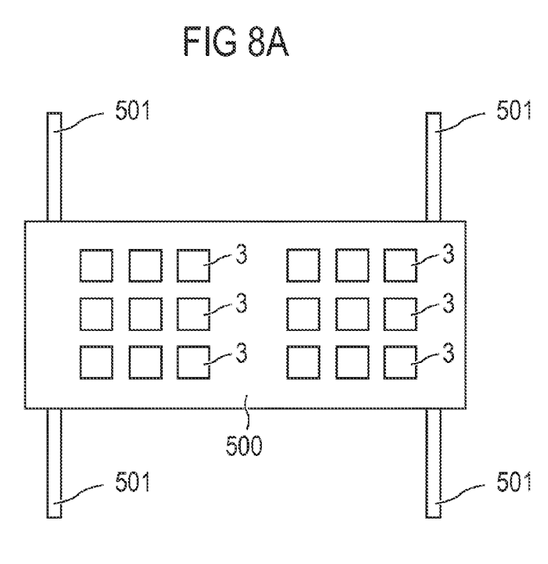
FIG. 8A is a bottom view of an extraction device to which several clip elements are mounted.
Figure 8B:
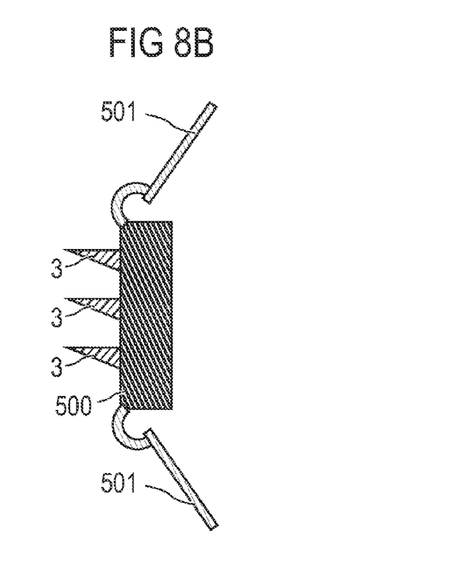
FIG. 8B is a side view of the extraction device of FIG. 8A.

In many applications, an electric device may be connected to another electric device by means of several connections as illustrated with reference to the examples FIG. 6B, 6C, 6D or 7, i.e., a number of clip elements 3 is required. In order to facilitate assembling and/or disassembling the electric connections between these devices, two or more clip elements 3 may be mounted on a common carrier 500 so that the clip elements 3 can be simultaneously inserted into the respective openings 21 of the second connector 2. FIG. 8A and the corresponding cross-sectional view of FIG. 8B illustrate an example for such a common carrier 500 to the bottom of which a number of clip elements 3 is mounted.

Figure 8C:
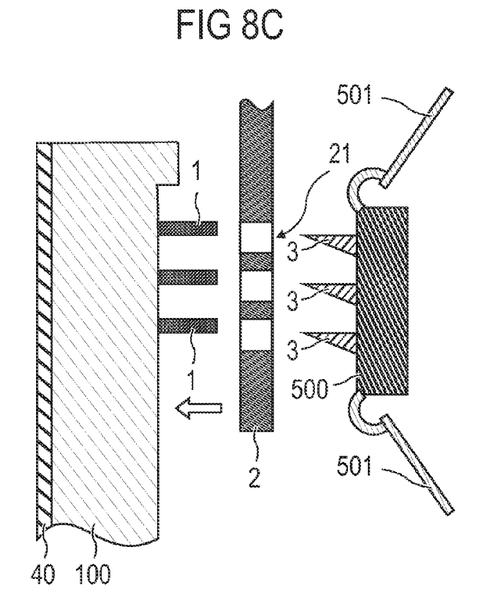
FIGS. 8C and 8D are respective side views of a power semiconductor module during attachment to a further device and the extraction device of FIG. 8A.
Figure 8D:
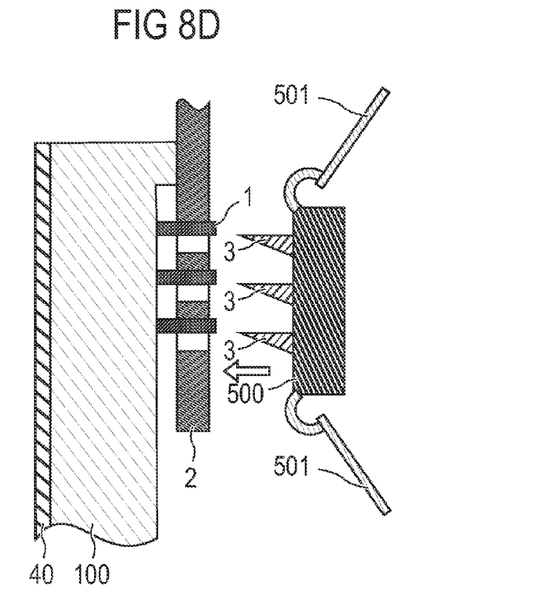

As can be seen from FIGS. 8C and 8D, a number of first connectors 1 of a power semiconductor module 100 can be inserted into electrical contact openings 21 of a further device, for instance a strip line 2. Subsequently, the tapered clip elements 3 arranged on the common carrier 500 can be inserted simultaneously into the corresponding contact openings 21 resulting in the arrangement of FIG. 8E.

Figure 8E:
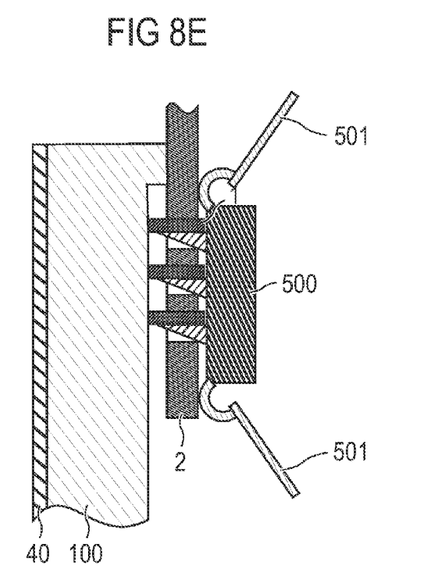
FIG. 8E is a side view of the power semiconductor module, further device and the extraction device of FIG. 8A after assembly.
Figure 8F:
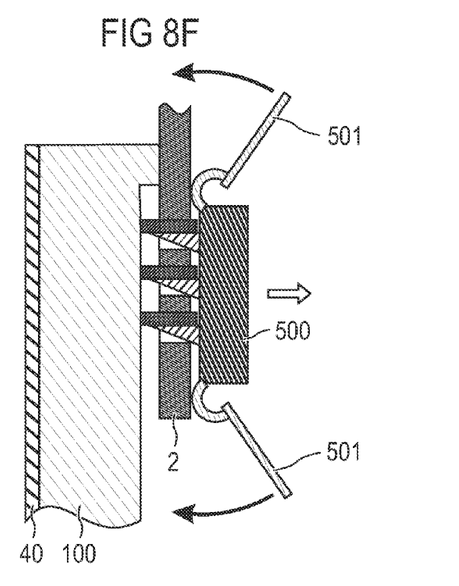
FIGS. 8F and 8G are respective side views of the assembly shown in FIG. 8E during disassembly.
Figure 8G:
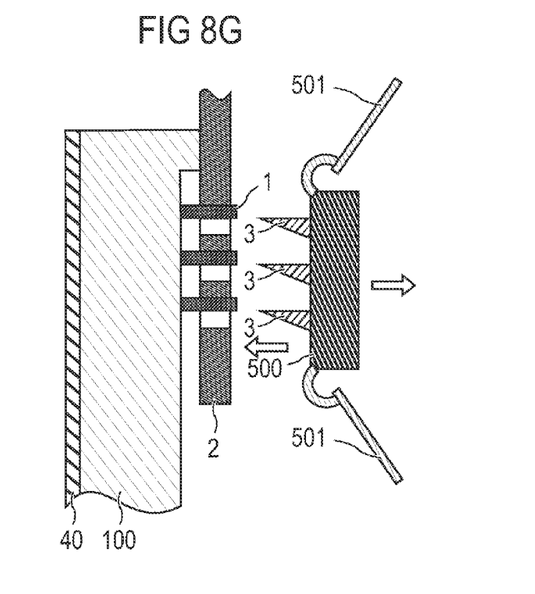

In order to disassemble the arrangement of FIG. 8E, the common carrier 500 has pivotable levers 501 which can be move toward the strip line 2 and the power semiconductor module 100, thereby bracing against the strip line 2. Alternatively, the pivotable levers 501 can be designed such that they brace against the power semiconductor module 100 when pivoted toward the power semiconductor module 100. Continuing in this way, the clip elements 3 are extracted out of the respective first openings 21 and the strip line 2 can be disconnected from the power semiconductor module 100 as illustrated in FIG. 8G. Instead of a strip line 2, arbitrary other devices can be connected to and disconnected from the power semiconductor module 100 in the same way.

Different connecting systems are exemplarily described previously herein referring to an electrical connection between a power semiconductor module 100 and a printed circuit board 200 or between a power semiconductor module 100 and a strip line 2. However, arbitrary other devices may be connected in the same manner. The shape of the first connector 1 and the second connector 2 may be varied as long as the described effect of generating a contact pressure, due to which the first connector 1 and the second connector 2 being pressed against one another, is achieved.

So as to reduce the electric resistance between the first connector 1 and the corresponding second connector 2, a clip element 3 may be electrically conductive. For instance, a clip element 3 may have, at a Temperature of 300 K, a specific resistance of less than 12 $\mu\Omega\cdot cm$, or of less than 3 $\mu\Omega\cdot cm$, or of less than 2 $\mu\Omega\cdot cm$.

A connection between the first connector 1 and the corresponding second connector 2 may be friction-locked but not form-locked. Alternatively, such connection may be both friction-locked and form-locked. Further, the electrical connection between the first connector 1 and the corresponding second connector 2 does not require any soldering, welding or gluing.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A connecting system for electrically connecting electronic devices, the connecting system comprising:
   an electrically conductive first connector;
   an electrically conductive second connector;
   a clip element that is separate from the electrically conductive first connector; and
   wherein the first connector is insertable in the second connector so that the first connector directly contacts the second connector upon insertion, the first connector comprises a first opening, and
   the clip element is designed to be inserted into the first opening and, without contacting the second connector while inserted in the first opening, to generate a contact pressure due to which the first connector and the second connector are pressed against one another so that an electrical contact between the first connector and the second connector is safeguarded.

2. The connecting system as claimed in claim 1, wherein the clip element is insertable into the first opening in a captive manner, even in a state in which the first connector is not inserted in the second connector.

3. The connecting system as claimed in claim 1, wherein the clip element is a spring ring having a closed or open ring-shape.

4. The connecting system as claimed in claim 1, wherein the clip element comprises a tapered section.

5. The connecting system as claimed in claim 1, wherein the clip element comprises a clearance.

6. The connecting system as claimed in claim 5, wherein, the clearance is arranged at least partly within the first opening when the clip element is inserted in the first opening.

7. The connecting system as claimed in claim 1, wherein the first connector is formed of copper or comprises at least 99.8 weight % copper.

8. The connecting system as claimed in claim 1, wherein the clip element is electrically conductive.

9. The connecting system as claimed in claim 1, wherein the clip element has, at a temperature of 300 K, a specific resistance of less than 12 $\mu\Omega\cdot cm$, or of less than 3 $\mu\Omega\cdot cm$, or of less than 2 $\mu\Omega\cdot cm$.

10. The connecting system as claimed in claim 1, wherein:
the first connector is inserted in the second connector; and
the clip element is inserted into the first opening and generates the contact pressure due to which the first connector and the second connector are pressed against one another so that an electrical contact between the first connector and the second connector is safeguarded.

11. The connecting system as claimed in claim 10, wherein the first connector and the second connector form an electrical connection which is friction-locked but not form-locked.

12. A power semiconductor module system comprising:
a power semiconductor module;
an electrical component electrically connectable to the power semiconductor module;
an electrically conductive first connector;
an electrically conductive second connector;
a clip element; and
wherein the first connector is insertable in the second connector so that the first connector directly contacts the second connector upon insertion, the first connector comprises a first opening, the clip element is designed to be inserted into the first opening and, while inserted in the first opening, to generate a contact pressure due to which the first connector and the second connector are pressed against one another so that an electrical contact between the first connector and the second connector is safeguarded, and either the first connector is a part of the power semiconductor module and the second connector is a part of the electrical component, or the second connector is a part of the power semiconductor module and the first connector is a part of the electrical component.

13. The power semiconductor module system as claimed in claim 12, wherein the electrical component is a strip line or a printed circuit board.

14. The power semiconductor module system as claimed in claim 12, further comprising an extraction device to which the clip element is mounted, and which is designed to extract the clip element out of the first opening.

15. The power semiconductor module system as claimed in claim 14, wherein the extraction device comprises a pivotable lever which is designed to brace against the electrical component or against the power semiconductor module if the lever is pivoted toward the power semiconductor module.

16. The power semiconductor module system as claimed in claim 12, wherein the clip element is electrically conductive.

17. A power semiconductor module system comprising:
a power semiconductor module with a first electrically conductive connector which serves to electrically connect the power semiconductor module with another electric device by a direct connection between the first electrically conductive connector and a second electrically conductive connector, wherein the first electrically conductive connector comprises an opening and is insertable into the second electrically conductive connector; and
a clip element, which is insertable or inserted in the opening, and is designed to be inserted into the first opening and, while inserted in the first opening, to generate a contact pressure due to which the first connector and the second connector are pressed against one another so that an electrical contact between the first connector and the second connector is safeguarded.

18. The connecting system of claim 1, wherein the clip element is insertable into the first opening, and wherein the clip element is configured to generate an expansive pressure on the first connector when inserted into the first opening such that, when the first connector is inserted in to the second connector with the clip element in the first opening, the first connector and the second connector are pressed against one another so that an electrical contact between the first connector and the second connector is safeguarded.

19. The connecting system of claim 1, wherein the clip element comprises a hollow center.

* * * * *